(12) United States Patent
Namiwaka et al.

(10) Patent No.: US 7,308,012 B2
(45) Date of Patent: Dec. 11, 2007

(54) SEMICONDUCTOR LASER MODULE AND METHOD OF ASSEMBLING THE SAME

(75) Inventors: Masahiko Namiwaka, Tokyo (JP); Taro Kaneko, Tokyo (JP)

(73) Assignee: NEC Corporation, Tokyo (JP)

( * ) Notice: Subject to any disclaimer, the term of this patent is extended or adjusted under 35 U.S.C. 154(b) by 267 days.

(21) Appl. No.: 10/877,786

(22) Filed: Jun. 25, 2004

(65) Prior Publication Data

US 2004/0264538 A1 Dec. 30, 2004

(30) Foreign Application Priority Data

Jun. 27, 2003 (JP) ............................. 2003-184622

(51) Int. Cl.
H01S 5/00 (2006.01)
(52) U.S. Cl. ........................ 372/50.1; 372/34
(58) Field of Classification Search .................. 372/75, 372/50.11, 50.121, 43.01, 34
See application file for complete search history.

(56) References Cited

U.S. PATENT DOCUMENTS

| | | | | | |
|---|---|---|---|---|---|
| 5,845,031 | A | * | 12/1998 | Aoki ........................... | 385/92 |
| 5,902,326 | A | * | 5/1999 | Lessar et al. ................. | 607/36 |
| 6,186,674 | B1 | * | 2/2001 | Basavanhally ............... | 385/88 |
| 6,275,317 | B1 | * | 8/2001 | Doerr et al. ................. | 398/201 |
| 6,456,635 | B1 | * | 9/2002 | Shiomoto et al. ............. | 372/36 |
| 6,488,419 | B2 | * | 12/2002 | Kato et al. .................... | 385/93 |
| 6,826,211 | B2 | * | 11/2004 | Tatsuno et al. ............... | 372/34 |
| 6,862,136 | B2 | * | 3/2005 | Koren et al. ................. | 359/344 |
| 6,876,682 | B2 | * | 4/2005 | Nakabayashi et al. ........ | 372/36 |
| 2002/0176476 | A1 | * | 11/2002 | Vakhshoori et al. ........ | 372/101 |
| 2003/0210729 | A1 | * | 11/2003 | Nakaya et al. ................ | 372/97 |

FOREIGN PATENT DOCUMENTS

| | | |
|---|---|---|
| EP | 0 259 018 | 3/1988 |
| EP | 0 450 385 A1 | 10/1991 |
| JP | 63-219186 | 9/1988 |
| JP | 04-274204 | 9/1992 |
| JP | 5-291694 | 11/1993 |
| JP | 7-140361 | 6/1995 |
| JP | 9-033780 | 2/1997 |

(Continued)

OTHER PUBLICATIONS

Partial European Search Report dated Oct. 5, 2004.

(Continued)

Primary Examiner—Minsun Oh Harvey
Assistant Examiner—Tuan Nguyen
(74) Attorney, Agent, or Firm—Katten Muchin Rosenman LLP

(57) ABSTRACT

Provided are a semiconductor laser module and a method of assembling the same. The semiconductor laser module comprises a first semiconductor optical element and a second semiconductor optical element as a pair and a lens. The first semiconductor optical element is for outputting light signal and the second semiconductor optical element is for performing signal processing on the light signal outputted from the first semiconductor optical element. The lens is for correcting a relation between optical axes of the first semiconductor optical element and the second semiconductor optical element so as to lens-couple the optical axes. The first semiconductor optical element, the second semiconductor optical element and the lens are mounted on a common element carrier.

10 Claims, 11 Drawing Sheets

FOREIGN PATENT DOCUMENTS

| | | |
|---|---|---|
| JP | 11-054842 | 2/1999 |
| JP | 2000-208869 | 7/2000 |
| JP | 2001-59925 | 3/2001 |
| JP | 2001-320124 | 11/2001 |
| WO | WO99/15928 | 4/1999 |
| WO | WO99/42879 | 8/1999 |
| WO | WO 02/082148 | 10/2002 |

OTHER PUBLICATIONS

European Search Report dated Dec. 10, 2004.
Communication pursuant to Article 96(2) EPC, dated May 16, 2007 for European Application 04 253 811.6.

* cited by examiner

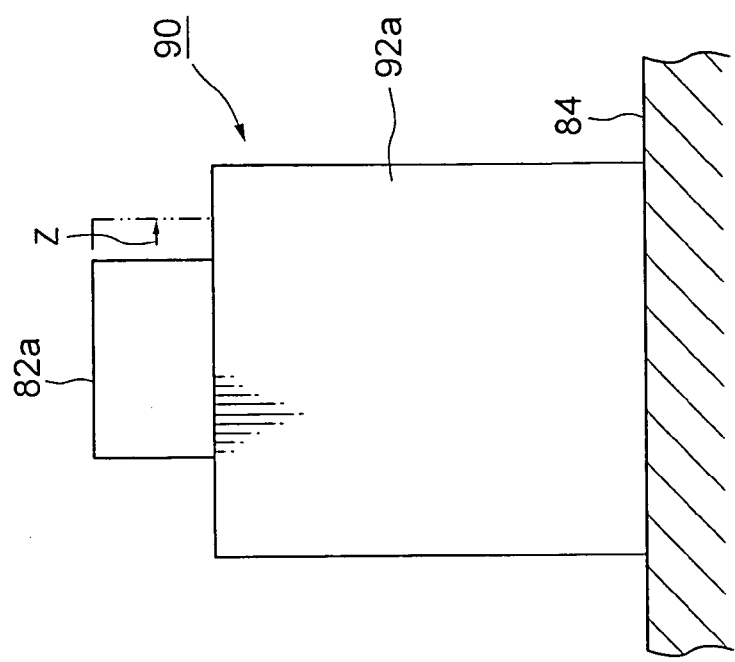
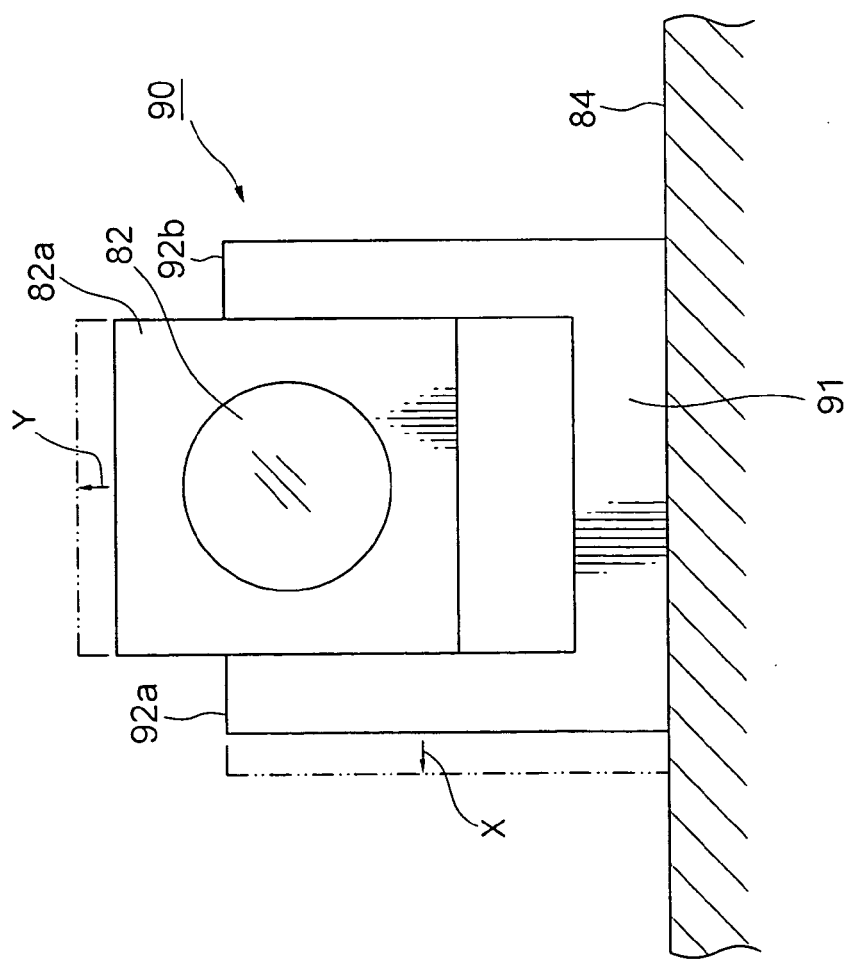
FIG. 4A PRIOR ART
FIG. 4B PRIOR ART

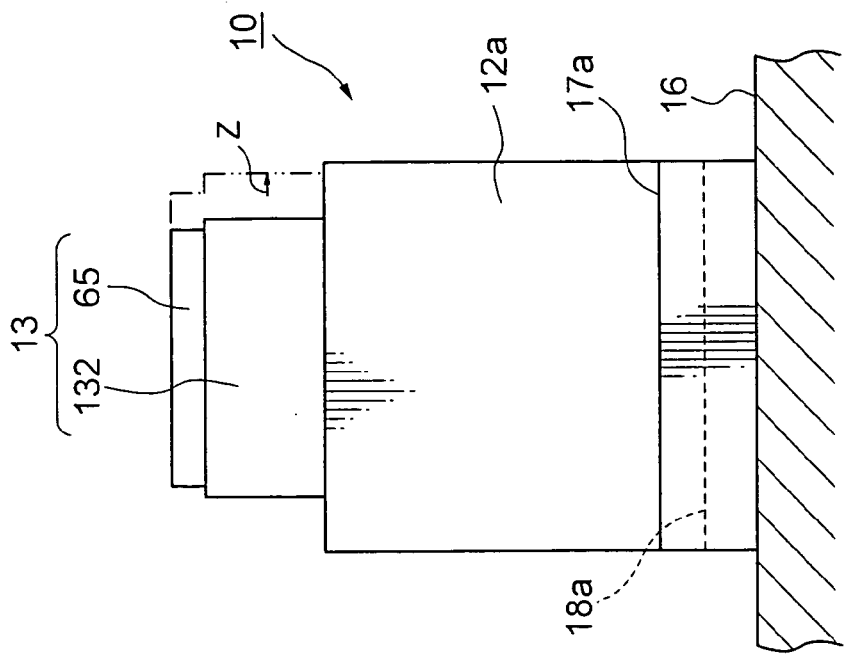
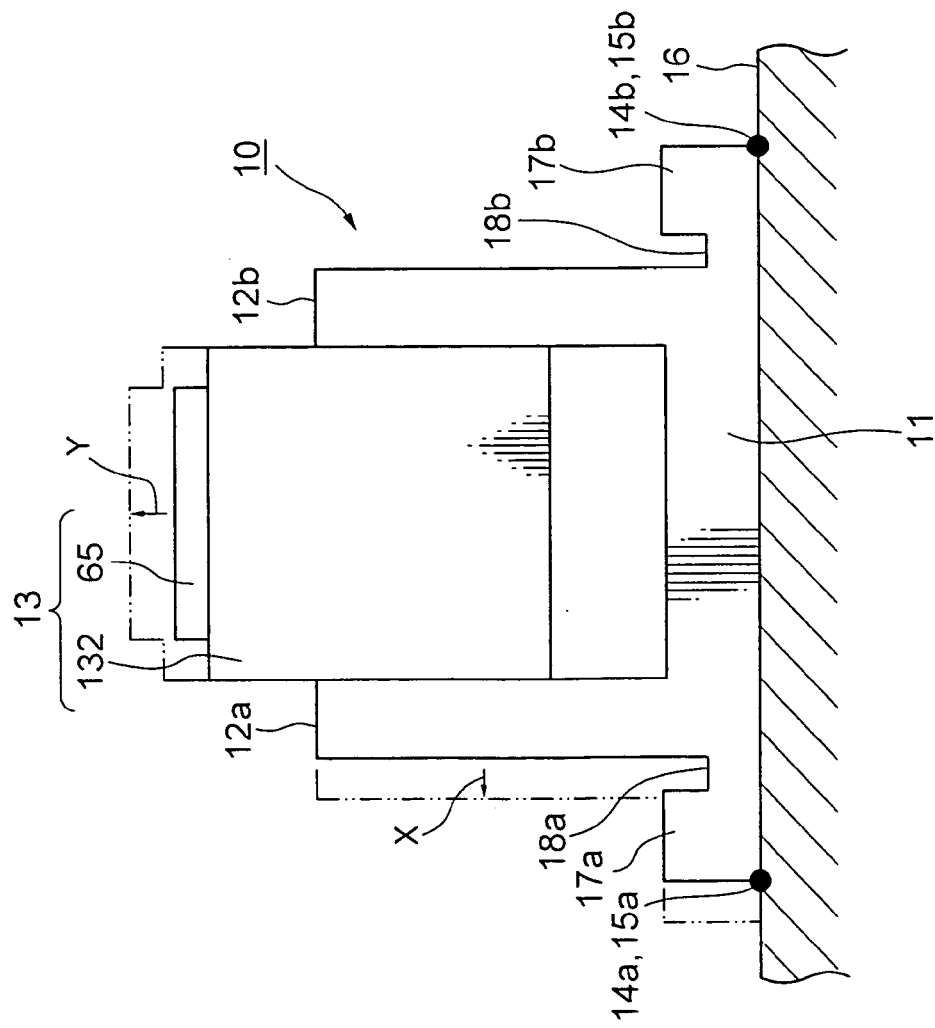

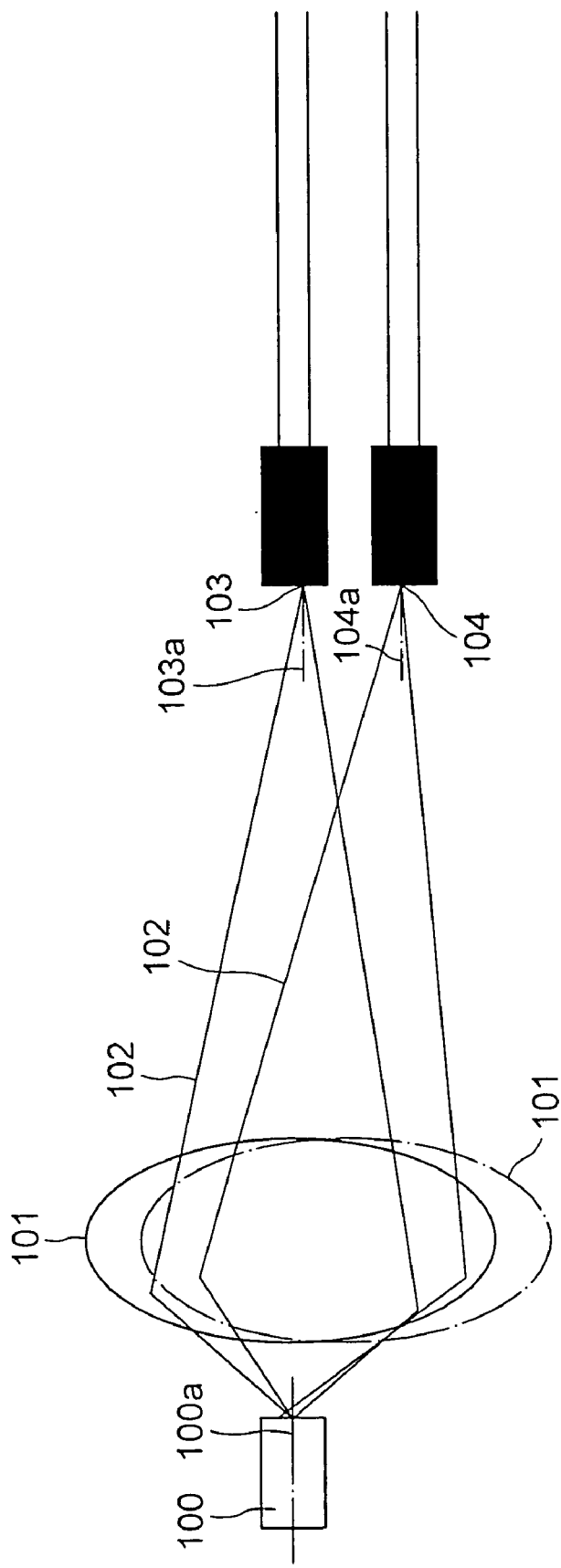

SEMICONDUCTOR LASER MODULE AND METHOD OF ASSEMBLING THE SAME

BACKGROUND OF THE INVENTION

1. Field of the Invention

The present invention relates to a semiconductor laser module used in the field of optical communication technology and a method of assembling the same.

2. Description of the Related Art

The optical communication system has grown with merits of having a large capacity and achieving a long distance transmission. As for the improved capacity of the optical communication system, information transmission of up to 10 Gbits has been made into practical use by improving the speed for modulating the light signal.

As for the increased transmission distance of the optical communication system, the transmission distance which can be achieved without a relay exceeds 100 km by combining an optical fiber in which losses of the optical transmission is small with an erbium-doped optical fiber amplifier (in the followings, referred to as EDFA).

However, the EDFA is formed with a large number of optical components such as an excitation LD module, an Er optical fiber, an optical isolator and the like. Thus, the size becomes too large so that it is unsuitable for achieving size reduction.

Accordingly, in order to meet the demands for size reduction on market, a semiconductor optical amplifier (in the followings, referred to as SOA) has been actively developed and manufactured in place for the EDFA. Compared to the EDFA, the SOA is advantageous that it is small in size, requires a low manufacturing cost and a low consumption of electricity, and so on.

A case of using the SOA will be described by referring to FIG. 1.

An optical transmission module 59 shown in FIG. 1 is used in an optical communication system with an optical transmission capacity of 10 Gbits. The optical transmission module 59 comprises a laser module 80 with a built-in optical modulator and an SOA module 60 with a built-in optical amplifier. The laser module 80 and the SOA module 60 are installed to respective packages 89 and 72, and both are connected by optical fibers 88 and 61.

As for the laser module 80, a distributed feedback (in the followings, referred to as DFB) laser element 81, a lens 82, a U-shape holder (not shown), an optical isolator 83, an element carrier 84, a Peltier device 85, a lens 86 and the like are installed inside one package 89. Further, the laser module 80 comprises a ferrule 87 and an optical fiber 88 on the output side.

The element carrier 84 is installed inside the package 89 through the Peltier element 85. The DFB laser element 81 and the optical isolator 83 are directly mounted on the element carrier 84. The lens 82 is supported by a frame 82*a* made of alloy and is mounted on the element carrier 84 through the frame 82*a*. The DFB laser element 81, the lens 82 and the optical isolator 83, with the optical axes being coincided, are mounted on the element carrier 84.

The DFB laser 81 is built in one chip integrally with the optical modulator. The light from the DFB laser element 81 is modulated in the optical modulator and the modulated light signal (signal light) is outputted. The lens 82 concentrates the signal light outputted from the DFB laser element 81 onto the optical isolator 83. The optical isolator 83 outputs the laser light from the DFB laser element 81 to the optical fiber 88 side and prevents the return light from the optical fiber 88 to the laser element 81.

The Peltier element 85 maintains the DFB laser element 81 at a constant temperature so as to stably output the modulated light signal from the optical fiber 88. The optical fiber 88 guides the signal light outputted from the optical isolator 83 to the outside of the package 89.

On the other hand, an SOA module 60, an optical fiber 61, a ferrule 62, a lens 63, a lens 64, an SOA element 65, a lens 66, a lens 67, a ferrule 68, an optical fiber 69, a carrier 70, and a Peltier element 71 are installed in a package 72.

In the top end portion of the optical fiber 61, a splice section 73 being connected to the optical fiber 88 is formed. Through the splice section 73, it is connected to the optical fiber 88 of the laser module 80 and guides the signal light outputted from the laser module 80 to the SOA module 60. The ferrule 62 fixes the optical fiber 61 to the package 72. The signal light outputted from the optical fiber 61 is guided to the lens 63. The lens 64 concentrates the signal light which has passed through the lens 63 onto the SOA element 65. The SOA element 65 operates based on the same principles as that of the semiconductor laser, in which optical amplification effect is excited on the incoming light from the outside by utilizing the gain function of the semiconductor active regions by a supply of the electric current. The lens 66 concentrates the signal light amplified by the SOA element 65 onto the lens 67. The ferrule 68 fixes the optical fiber 69 to the package 72. The signal light outputted from the optical fiber 69 is guided to the lens 67. The optical fiber 69 guides the signal light amplified by the SOA element 65 to the outside the package 72.

In order to be used for the long-distance optical communication, the signal light outputted from the DFB laser element 81 alone is not sufficient. Therefore, in the optical transmission module 59, the signal light from the DFB laser element 81 is amplified by supplying a current in the SOA element 65 to be outputted as the high-output light from the optical fiber 69.

As described above, the laser module 80 and the SOA module 60 are separately formed by being installed into respective packages. The optical fiber 88 of the laser module 80 and the optical fiber 61 on the input side of the SOA module 60 are unified by fusion-splicing to be used.

Further, recently, more high-speed and large-capacity optical communication system has been in advance. Accordingly, even higher reliability is required in the optical communication modules such as the laser module and the SOA module used for the optical communication system. As a means for achieving the high reliability, in general, widely used is a method in which the optical elements such as the optical lens and the optical fiber, which constitute the optical communication module, are fixed by laser welding (YAG weld fixing).

A conventional laser module disclosed in Japanese Unexamined Patent Publication No. 2000-208869 has a configuration as shown in FIG. 2.

As shown in FIG. 2, a lens 82 is mounted to an element carrier 84 using a U-shape holder 90.

First, weld parts 94*a*, 95*a* of the U-shape holder 90 are laser-welded to an element carrier 84 so as to mount the U-shape holder 90 onto the element carrier 84. Subsequently, a frame 82*a* of the lens 82 is laser-welded to weld parts 96*a*, 97*a* of the U-shape holder 90 so as to fix the lens 82 to the U-shape holder 90. At last, weld parts 98*a*, 99*a* of an optical isolator 83 are laser welded to the element carrier 84 so as to mount the optical isolator 83 onto the element carrier 84. In FIG. 2, weld parts (not shown) which are symmetrical with the weld parts 94a to 99a are provided on the opposite side which are not recognized in the figure.

On a Peltier element 85, the element carrier 84 to which a DFB laser element 81 is mounted is disposed. In order to effectively guide the optical output of the DFB laser element 81 to the optical fiber 88, it is necessary to precisely adjust the lens 82 in the emitting position of the DFB laser element 81 to be fixed to the element carrier 84. For this, the U-shape holder 90 is widely used.

FIG. 3 and FIG. 4 show a conventional U-shape holder 90 disclosed in Japanese Unexamined Patent Publication No. 07-140361.

As shown in FIG. 3 and FIG. 4, in the U-shape holder 90, a pair of opposing holding sections 92a, 92b are formed by projecting on the surface of a plate-type pedestal 91 so as to hold the lens 82 by the inner side surface of the holding sections 92a, 92b. At the same time, weld parts 94a, 95a provided on the outer side of the holding sections 92a, 92b are laser-welded. Thereby, the rear side of the pedestal 91 is fixed to the element carrier 84.

Next, described is a method of adjusting the optical axis of the lens 82 and mounting the lens 82 onto the element carrier 84. First, the frame 82a of the lens 82 is inserted to the U-shape holder 90 (FIG. 4A). By guiding the holder 90, the lens 82 is positioned in front of the DFB laser element 81 so as to dispose the lens 82 on the element carrier 84. Next, the optimum position of the lens 82 in the three axes directions is adjusted while making the DFB laser element 81 emit the light.

Specifically, as shown in FIG. 4A, the holder 90 is moved on the element carrier 84 in the direction (X direction) orthogonal to the optical axis so as to adjust the lens 82 in the optimum position with respect to the DFB laser element 81. Then, the holder 90 is laser-welded to the element carrier 84.

Subsequently, with the holder 90 being a guide, as shown in FIG. 4A, the lens 82 is moved in the vertical direction of the holder 90 so as to adjust the lens 82 in the optimum position in the Y direction with respect to the DFB laser element 81. Then, as shown in FIG. 4B, the lens 82 is moved in the direction along the optical axis (lateral direction in FIG. 4B) so as to adjust the lens 82 in the optimum position in the Z direction with respect to the DFB laser element 81. After completing the position adjustments, the frame 82a of the lens 82 is laser-welded to the holding sections 92a, 92b of the holder 90.

However, in a conventional optical transmission module, the laser module and the SOA module are installed in separate packages. Thus, there is a limit in reducing the size. Accordingly, it is inevitable that the size of the optical communication module becomes large. Also, the optical communication module is formed with two module components so that it takes time to set them up.

There are following shortcomings in the conventional U-shape holder 90. The shortcomings are emphasized in FIG. 5 and they are to be described by referring thereto.

As shown in FIG. 5, the bottom ends of the holding sections 92a, 92b of the holder 90 are welded to the element carrier 84, thereby forming the weld parts (95a, 95b) between the bottom ends of the holding sections 92a, 92b and the element carrier 84. In these weld parts (95a, 95b), a welding stress as shown by an arrow is generated when being shrunk after the welding. The welding stress is generated when the inner structures of the holder 90 and the element carrier 84 are pulled towards the weld parts (95a, 95b) sides. In this case, the mass of the element carrier 84 is sufficiently large as compared to that of the holder 90 so that it is hard to be affected by the welding stress. On the other hand, when there is the welding stress generated in the bottom ends of the holding sections 92a, 92b, as shown in FIG. 5, the opposing holding sections 92a, 92b are deformed curving towards the outer side being away from each other due to the welding stress since the holder 90 is formed in a forked shape.

When adjusting the lens 82 to be in the optimum position in the Y direction and Z direction as shown in FIG. 4A and FIG. 4B, the two holding sections 92a, 92b as the reference are deformed by the welding stress as shown in FIG. 5. Thus, it is impossible to adjust the lens 82 to be in the optimum position in the Y direction and Z direction.

Further, when the holding sections 92a, 92b are deformed by receiving the welding stress, the top ends of the two holding sections 92a, 92b are deformed in the expanding direction as shown in FIG. 5 since they are formed in a forked shape.

When a frame 82a for supporting the lens 82 is welded to the two holding sections 92a, 92b, a clearance 96 is formed between the frame 82a and the holding sections 92a, 92b. Due to the clearance 96, when welding the frame 82a for supporting the lens 82 to the holding sections 92a, 92b, weld part 97b for welding therewith is formed inside the clearances 96. Thus, the frame 82a cannot be successfully welded to the holding sections 92a, 92b, which causes a trouble when determining the position of the lens 82.

SUMMARY OF THE INVENTION

An object of the present invention is to provide a semiconductor laser module and a method of assembling the same which enables, with a high yield, to reduce the size of an optical transmission module using a plurality of semiconductor optical elements.

In order to achieve the foregoing object, the semiconductor laser module according to the present invention comprises a first semiconductor optical element and a second semiconductor optical element as a pair and a lens. The first semiconductor optical element is for outputting a light signal while the second semiconductor optical element is for performing signal processing on the light signal outputted from the first semiconductor optical element. The lens is for correcting a relation between optical axes of the first semiconductor optical element and the second semiconductor optical element so as to lens-couple the optical axes. The first semiconductor optical element, the second semiconductor optical element and the lens are mounted on a common element carrier.

There may be a case where a semiconductor laser element is used as the first semiconductor optical element and a semiconductor optical amplifier is used as the second semiconductor optical element for performing signal processing on the light signal outputted from the first semiconductor optical element. In this case, it is impossible to install the semiconductor laser element and the semiconductor optical amplifier in one chip with the existing semiconductor manufacturing technology.

Thus, in the present invention, the relation between the optical axes of the semiconductor laser element as the first semiconductor optical element and the semiconductor optical amplifier as the second semiconductor optical element are corrected and the optical axes are lens-coupled by a lens to be mounted on a common element carrier. In other words, in the present invention, by lens-coupling, it enables to achieve the same configuration as that of the case where the semiconductor laser element as the first semiconductor optical element and the semiconductor optical amplifier as the second semiconductor optical element are installed in one chip. In the present invention, the semiconductor optical elements are mounted on the common element carrier. Thereby, the number of carriers, packages, electronic cooling elements, optical output devices (for example, optical fibers) and the like can be reduced. At the same time, it becomes unnecessary to connect the optical fiber so that it enables to reduce the number of components, reduce the size and simplify the manufacture. Furthermore, by the lens-coupling, only the good-quality items of the semiconductor optical elements can be selected to be mounted on the element carrier so that the yield of the whole module can be improved. Moreover, a plurality of the semiconductor elements are mounted on the common carrier so that the temperatures of the plurality of the semiconductor optical elements can be maintained at the same temperatures. Thus, the temperature properties can be stabilized.

Further, it is possible to use a semiconductor laser element for outputting the laser light as the first semiconductor optical element and to use a semiconductor optical amplifier, which amplifies the light signal by exciting it in an active layer through supplying an electric current and then outputs the amplified light signal, as the second semiconductor optical element. Also, as the second semiconductor optical element, a semiconductor optical modulator, which modulates and outputs the laser light outputted from the semiconductor laser element, may be used. The semiconductor optical modulator as the second semiconductor optical element may be formed integrally with the semiconductor laser element in one chip.

It is desirable that the element carrier comprise: element holding sections to which the semiconductor optical elements are mounted; and a lens holder being disposed between the element holding sections to be capable of adjusting a holding position of the lens with respect to the semiconductor optical element three-dimensionally.

In this case, it is desirable that the lens holder be in a configuration comprising: a pedestal having forked-shape holding sections; fixing sections for fixing the pedestal to the element carrier; and a stress-suppressing section disposed between the holding sections and the fixing sections, wherein the stress-suppressing section is for preventing a welding stress, which is generated when the fixing section is welded to the element carrier, from affecting the holding sections.

With the present invention, by using the above-described lens holder for mounting the lens to the element carrier, it enables to suppress the welding stress even when the lens holder is welded to the element carrier. Thereby, position shift of the lens for correcting the optical axes of the first and second semiconductor optical elements can be suppressed to the minimum. Therefore, it enables to prevent the lens-coupling from being affected by welding.

It is desirable that the element carrier be in a configuration comprising the element holding sections and the lens holder in one surface, and the opposite surface is formed flat to be supported by the electronic cooling element.

With the configuration, the temperature of the element carrier can be maintained uniform so that the temperature properties of the semiconductor optical elements mounted on the element carrier can be maintained to be the same.

It is possible to have a configuration in which an optical isolator is disposed between the semiconductor laser element and the semiconductor optical amplifier, wherein the semiconductor laser element and the optical isolator are lens-coupled by a lens while the optical isolator and the semiconductor optical amplifier are lens-coupled using a lens, respectively.

With the configuration, the relation between the optical axes of the above-described elements can be appropriately maintained and the laser light returning to the semiconductor laser element can be prevented.

Further, a method of assembling the semiconductor laser module according to the present invention executes a mounting step of mounting, on a common element carrier, a first semiconductor optical element for outputting light signal and a second semiconductor optical element for performing signal processing on the light signal outputted from the first semiconductor optical element; and a coupling step of lens-coupling the first semiconductor optical element and the second semiconductor optical element by a lens.

It is desirable that, in the coupling step, a relation between optical axes of the first semiconductor optical element and the second semiconductor optical element being mounted on the element carrier be corrected so as to lens-couple the optical axes by the lens.

BRIEF DESCRIPTION OF THE DRAWINGS

FIG. 4A shows a front elevational view of the optical element holder shown in FIG. 3 while FIG. 4B shows a side view of the optical element holder;

FIG. 8A shows a front elevational view of the optical element holder shown in FIG. 6 while FIG. 8B shows a side view of the optical element holder;

FIG. 11 is an illustration for describing the principle of correcting the optical axis of the semiconductor optical element using a lens.

DETAILED DESCRIPTION OF THE PREFERRED EMBODIMENTS

In the followings, embodiments of the present invention will be described by referring to accompanying drawings.

As a basic configuration, the semiconductor laser module according to the present invention comprises a first semiconductor optical element and a second semiconductor optical element as a pair and a lens. The first semiconductor optical element is for outputting the light signal and the second semiconductor optical element is for performing signal processing on the light signal outputted from the first semiconductor optical element. The lens is for correcting a relation between optical axes of the first semiconductor optical element and the second semiconductor optical element so as to lens-couple the optical axes. Further, the first semiconductor optical element, the second semiconductor optical element and the lens are mounted on a common element carrier.

Next, with reference to FIG. 6, a first embodiment of the present invention will be described by referring to a case where: a semiconductor laser element (in the followings, referred to as a DFB laser element) 81 as a first semiconductor optical element for outputting laser light; and a semiconductor optical amplifier (in the followings, referred to as an SOA element) 65 as the second semiconductor optical element, which amplifies the light signal by exciting it in an active layer through supplying an electric current and outputs the amplified light signal, are used. The semiconductor optical elements are not limited to the semiconductor laser element and the semiconductor amplifier but other elements may be used.

Figure 6:
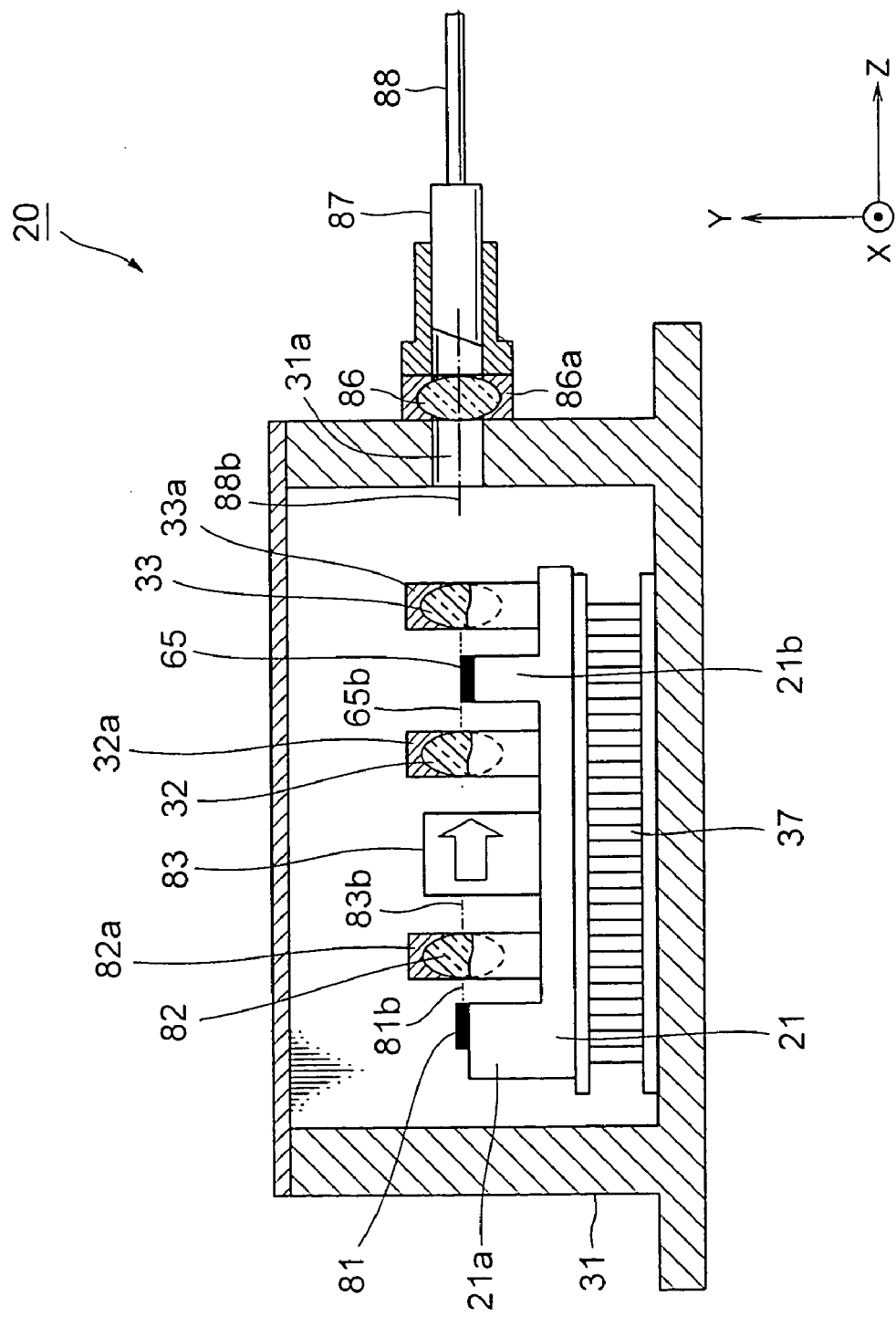
FIG. 6 is a block diagram showing a first embodiment of a laser module according to the present invention.

As shown in FIG. 6, an element carrier 21 is enclosed inside a package 31 by being supported by a Peltier element 37 as an electronic cooling element. The element carrier 21 comprises, on one face (surface), an element holding section 21a to which the DFB laser element 81 is mounted and an element holding section 21b to which the SOA element 65 is mounted. The holding sections 21a, 21b are formed being away from each other in front-and-rear direction (lateral direction in FIG. 6) by projecting upwards from the element carrier 21. Further, the opposite side of the element carrier 21 is formed flat and the flat surface is supported by the Peltier element 37 so that the temperature property inside the surface is to be maintained uniform. The temperature of the element carrier 21 is measured by a temperature sensor (not shown) and a controller (not shown) controls the temperature of the Peltier element 37 based on the temperature measurement signal transmitted from the temperature sensor. This configuration is widely used so that the illustration is omitted.

The DFB laser element 81 is mounted by being joined to one of the element holding sections, 21a, of the element carrier 21 by solder such as AuSn and the like. The DFB laser element 81 is mounted so that the outputted laser light proceeds to the other element holding section 21b. The SOA element 65 is mounted by being joined to the other element holding section 21b of the element carrier 21 by solder such as AuSn and the like. Further, the optical isolator 83 is disposed between the two element holding sections 21a, 21b. The optical isolator 83 is mounted by being joined to the plate-type surface of the element carrier 21 as the element holding sections by solder such as AuSn and the like.

There is an permeation hole 31a being opened in the package 31 at a height where the light signal outputted from the SOA element 65 is to permeate through the outside. In the permeation hole 31a of the package 31, the lens 86 is mounted by being supported by a frame 86a, and an optical fiber 88 is connected to the lens 86 by being supported by a ferrule 87.

In FIG. 6, in order to improve the optical transmission efficiency, it is necessary that the optical axes of the DFB laser element 81, the SOA element 65 and the optical isolator 83 being mounted on the element carrier 21 coincide with each other and the light signal from the SOA element 65 enters the optical fiber 88.

Since the DFB laser element 81, the SOA element 65, and the optical isolator 83 are mounted on the element carrier 21 by solder-bonding, there may be cases where the mounting positions are shifted in the vertical and lateral directions. Due to the shift, the optical transmission efficiency may be deteriorated.

Now, the lens property will be discussed. In general, lenses are used for concentrating the light. As shown in FIG. 11, the inventors investigated other properties of the lens. In FIG. 11, light 102 is emitted from a light-emitting element 100 and enters a lens 101. In this case, the lens 101 concentrates the light 102 and focuses it on a first position 103. The position of the lens 101 in this state is shown by a solid line. When moving the lens 101 shown by a solid line in the bottom direction shown by an alternate long and short dash line, the light 102 concentrated by the lens 101 is focused on a second position 104.

In FIG. 11, an optical axis 100a of the light-emitting element 100 and an optical axis 103a of the first position 103 coincide with each other. As can been seen from FIG. 11, an optical axis 104a of the second position 104 and the optical axis 100a of the light-emitting element 100 are shifted from each other in the vertical direction. Even though the two optical axes 100a, 103a are shifted from each other in the vertical direction as described, it is possible to substantially coincide the optical axis 100a of the light-emitting element 100 and the optical axis 104a of the second position 104 by adjusting the position of the lens 101.

In the present invention, according to the analysis based on FIG. 11, the mutual relations between optical axis 81b of the semiconductor optical element 81, optical axis 83b of the semiconductor optical element 83 and optical axis 65b of the semiconductor optical element 65 being mounted on the element carrier 21 are corrected by using lenses 82, 32, 33 for lens-coupling the optical axes 81b, 83b, 65b.

The optical path of the optical isolator 83 used in the embodiment shown in FIG. 6 is about 1000 µm (1 mm) so that the light emitted from the DFB laser element 81 passes through the optical isolator 83 by simply disposing it without correcting the optical axis by the lens. On the other hand, the optical path of the SOA element 65 is as small as 1 µm. Thus, it is necessary to adjust the optical path so that the light emitted from the DFB laser element 81 and passed through the optical isolator 83 enters the SOA element 65 with a high precision.

Thus, the lens 82 disposed between the DFB laser element 81 and the optical isolator 83 and the lens 32 disposed between the optical isolator 83 and the SOA element 65 are moved in the vertical and lateral direction, i.e., three-dimensionally. Thereby, the optical axis is adjusted so that the light emitted from the DFB laser element 81 and passed through the optical isolator 83 enters the SOA element 65 with a high precision. Accordingly, the optical axis 81b of the DFB laser element 81, the optical axis 83b of the optical isolator 83 and the optical axis 65b of the SOA element 65 coincide with each other to be lens-coupled by the lenses 82 and 32.

Further, the mutual relation between the optical axis 65b of the SOA element 65 and the optical axis 88b of the optical fiber 88 is corrected by moving the lens 33 in the vertical and lateral direction, i.e., three-dimensionally, for lens-coupling the optical axes 65b, 88b.

The lens 82 converts the diffused light from the DFB laser element 81 into the collimated light. The lens 32 concentrates the collimated light onto the incident end face of the SOA element 65. The lens 32 and the SOA element 65 are fixed to the element carrier 21 by laser welding and the like after being adjusted with a high precision to coincide with the collimated light from the lens 82 so that losses can be suppressed to be the minimum. The lenses 33, 86 on the output side of the SOA element 65 convert the light signal amplified by the SOA element 65 and concentrate it on the end face of the optical fiber 88. As in the same manner as that of the lenses 82, 32, the lenses 33, 86 are also fixed after being adjusted with a high precision with respect to the emitting end face of the SOA element 65.

Also, the optical isolator 83 disposed between the lens 82 and the lens 32 hinders the return light so that the spectrum of the DFB laser element 81 is not disturbed by the reflected light. The signal light outputted from the DFB laser element 81 enters the SOA element 65 through the lens 82, the optical isolator 83 and the lens 32 and is outputted therefrom as a high-output light after being amplified. The emitted light enters the end face of the optical fiber 88 through the lenses 33, 86 and lead out from the optical fiber 88.

Figure 1:
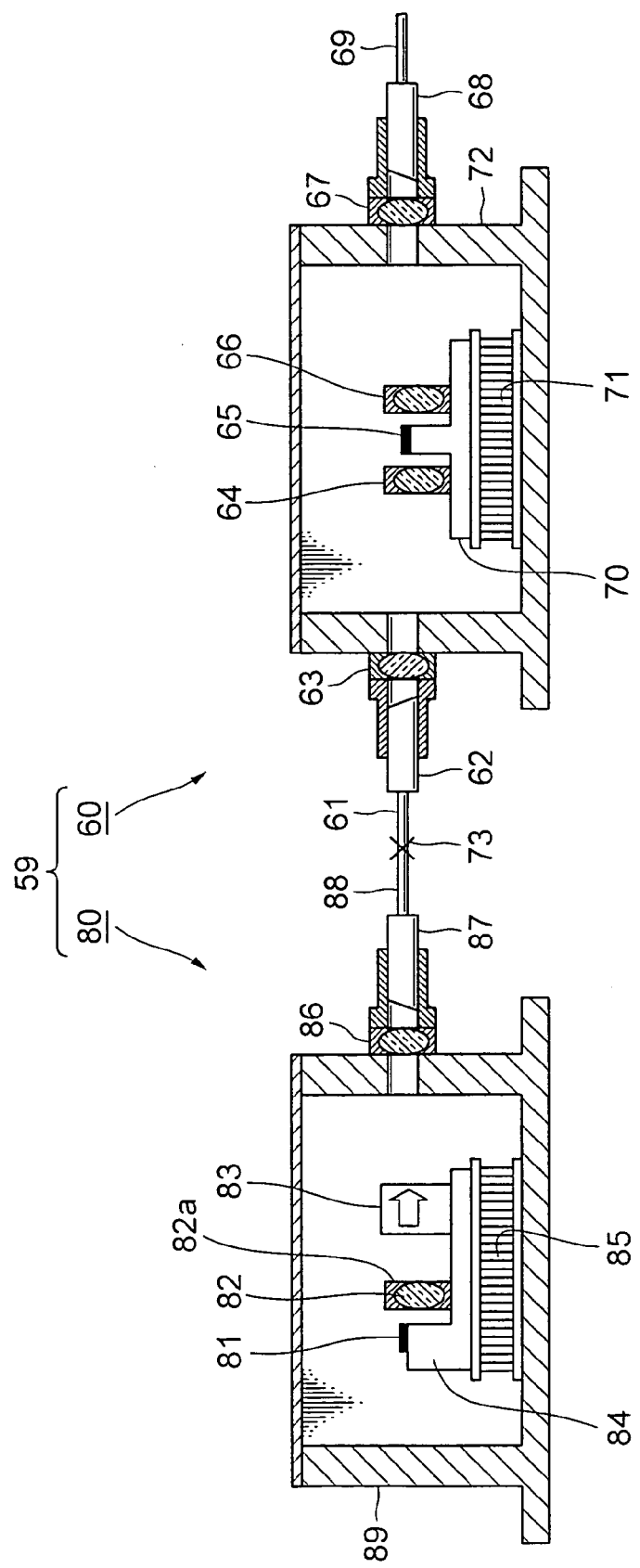
FIG. 1 is a block diagram showing a conventional optical transmission module.
Figure 2:
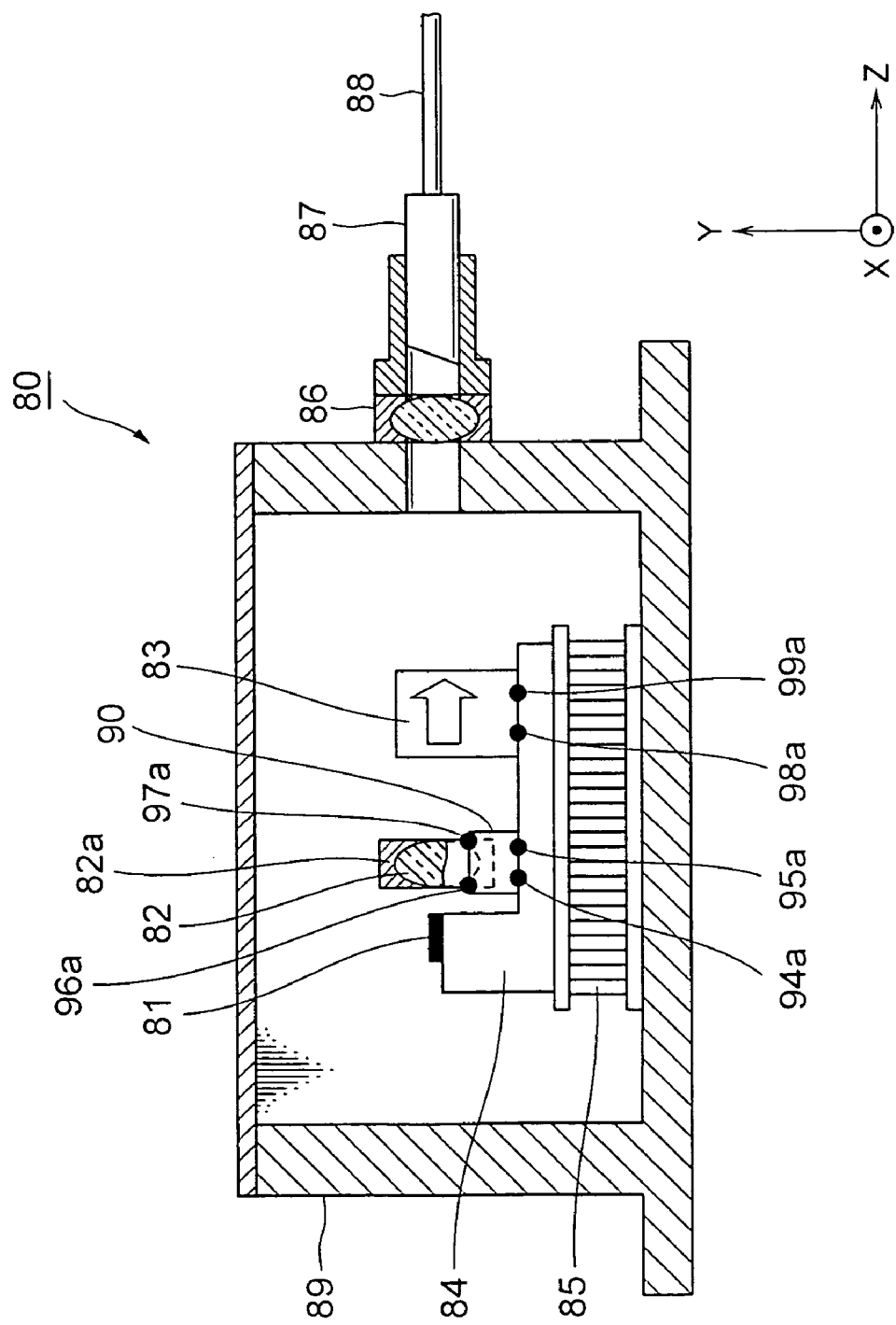
FIG. 2 is a block diagram showing a conventional laser module fabricated by laser welding.
Figure 3:
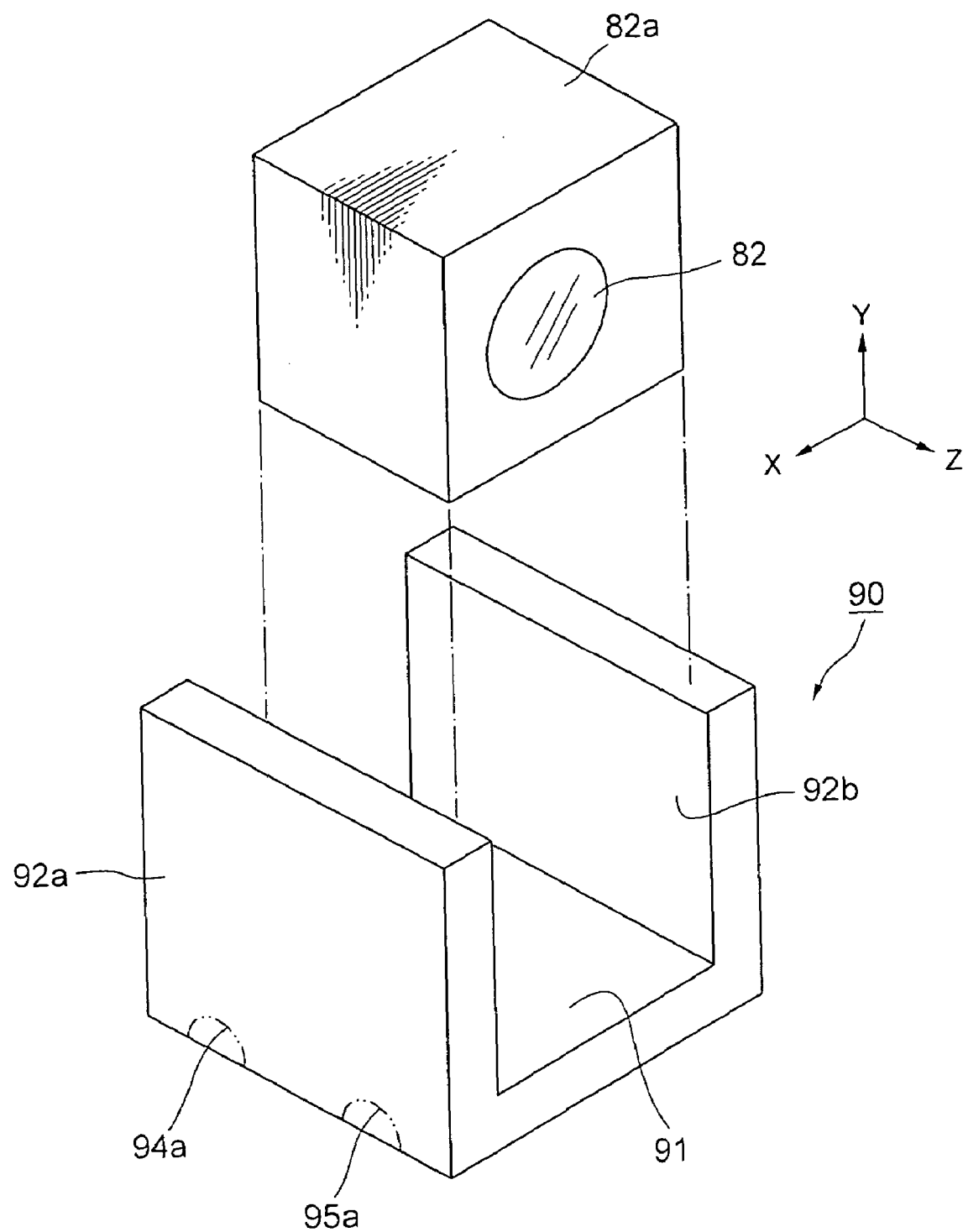
FIG. 3 is a perspective view showing a conventional optical element holder.
Figure 5:
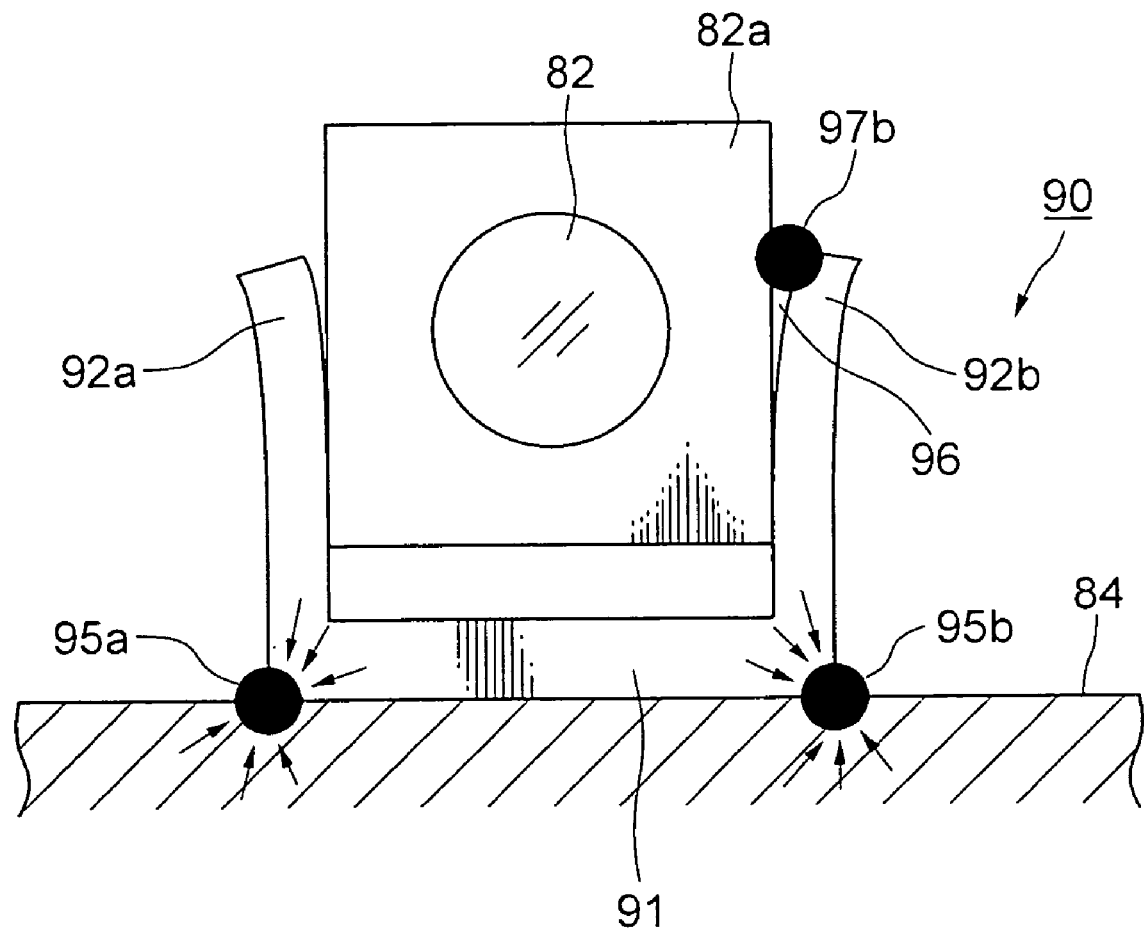
FIG. 5 is a front elevational view illustrating the shortcomings of the conventional optical element holder.

In the related art, the DFB laser element 81 and the SOA element 65 are installed in separate packages and the packages are connected by the optical fiber to be used. On the contrary, in the embodiment, the DFB laser element 81 and the SOA element 65 are installed in a same package 31. Thus, the number of carriers, packages, optical fibers and the like can be reduced and it becomes unnecessary to connect the optical fibers. Thereby, it enables to reduce the number of components, reduce the size, and simplify the manufacture. Furthermore, only the good-quality items of each optical element are to be mounted to the carrier so that the yield of the whole laser module 20 can be improved. As evident from comparing it to the related art shown in FIG. 1, a large number of the components are reduced, i.e., the number of package is decreased from two to one, the carrier from two to one, the Peltier element from two to one, the lenses from six to four, the ferrule from three to one, the optical fiber from three to one, the splice section from one to zero, and etc.

The present invention uses the optical element holder for holding the lens, which lens-couples the optical axes, to be capable of adjusting the positions three-dimensionally. After adjusting the position of the lens, the lens is fixed to the optical element holder by welding. The optical element holder used in the present invention will be described by referring to FIG. 7 and FIG. 8. Using the optical element holder, the semiconductor optical elements other than the lens may be held.

In an optical element holder 10, a pair of opposing holding sections 12a, 12b are formed on the surface side of a plate-type pedestal 11. An optical element 13 is held by the inner sides of the holding sections 12a, 12b while fixing sections 17a, 17b are formed on the outer side of the holding sections 12a, 12b by overhanging from the pedestal 11 in the lateral direction.

Weld parts 14a, 15a are provided in the top end portions of the fixing sections 17a, 17b and the pedestal 11 is to be fixed to the element carrier 16 (FIG. 8) by welding the weld parts 14a, 15a to the element carrier 21.

When welding the fixing sections 17a, 17b to the element carrier 16, there is a welding stress generated in the weld parts 14a, 15a. When the welding stress affects the holding sections 12a, 12b through the fixing sections 17a, 17b, the holding sections 12a, 12b are to be deformed.

Thus, in the present invention, a stress-suppressing section is formed between the fixing sections 17a, 17b and the holding sections 12a, 12 of the optical element holder 10 so as to suppress the welding stress affecting the holding sections 12a, 12b through the fixing sections 17a, 17b.

Figure 7:
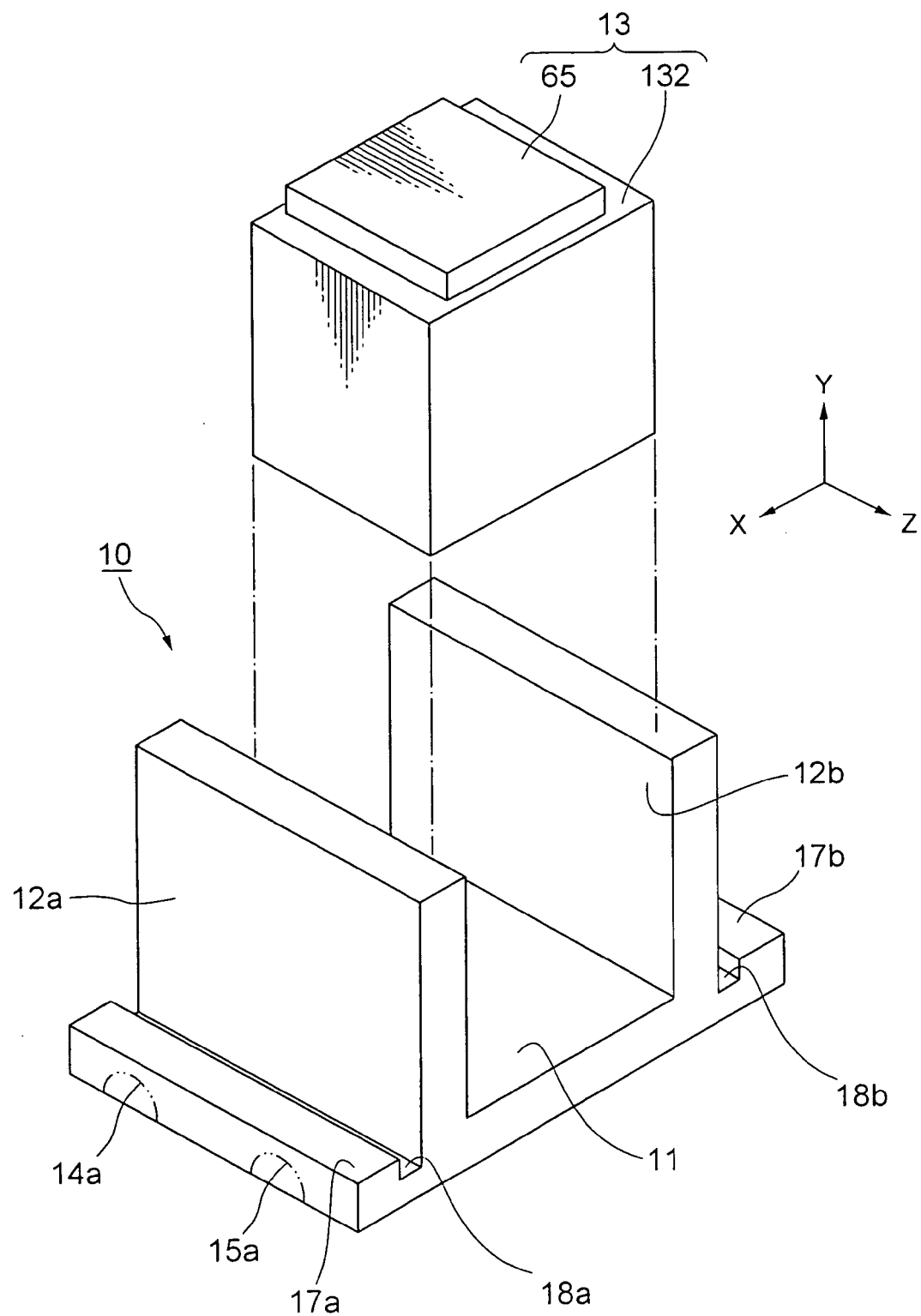
FIG. 7 is a perspective view showing an optical element holder used in a first embodiment of the laser module according to the present invention.

In the embodiment shown in FIG. 7, the stress-suppressing section is formed by notches. Notches 18a, 18b as the stress-suppressing section are formed between the weld parts 14a, 15a and the holding sections 12a, 12b. The notches 18a, 18b are provided on the side of the fixing sections 17a, 17b, which is non-contact with the element carrier 16, so as to form a straight line orthogonal to the direction of the stress propagation. Thereby, the stress generated by welding can be successfully eased to suppress the deformation of the holding sections 12a, 12b.

In the optical element 13, the SOA element 65 is die-bonded to the frame 132 by solder such as AuSn and the like. The optical element holder 10, the frame 132 and the element carrier 16 are made of a material which is suitable for laser welding, Fe—Ni—Co alloy and the like. As the laser welding, for example, YAG laser may be used.

As shown in FIG. 8A, the optical element 13 together with the optical element holder 10 are slidable with respect to the element carrier 16 in the X-axis direction. Further, the optical element 13, as shown in FIG. 8A, is slidable in the Y-axis direction (in the vertical direction in FIG. 8A) having a pair of opposing holding sections 12a, 12b of the optical element holder 10 as a guide. Furthermore, the optical element 13, as shown in FIG. 8B, is slidable in the Z-axis direction (in the lateral direction in FIG. 8B) along the optical-axis direction. Thereby the optical element 13 is adjustable three-dimensionally in the directions of X-Y-Z axes. In FIG. 7, on the opposite side which cannot be viewed in the figure, weld parts 14b, 15b (not shown) are also provided symmetrically with the weld parts 14a, 15a.

Next, the case of adjusting the optical element 13 three-dimensionally will be described. The optical element 13 is held by the inner sides of the holding sections 12a, 12b provided on the pedestal 11, and the pedestal 11 is mounted onto the element carrier 16. In the embodiment, lenses 82, 32, 33 are used as the optical element 13. The lenses 82, 32, 33 are held by the optical element holder 10 and the positions are three-dimensionally adjusted, respectively, between the DFB laser element 81 and the optical isolator 83, between the optical isolator 83 and the SOA element 65, and between the SOA element 65 and the optical fiber 88. Then, relation between with the optical axes of the DFB laser element 81 and the optical isolator 83 are corrected by the lens 82. The optical axes of the DFB laser element 81 and the optical isolator 83 are lens-coupled by the lens 82. Further, relation between the optical isolator 83 and the SOA element 65 are corrected by the lens 32. The optical axes of the optical isolator 83 and the SOA element 65 are lens-coupled by the lens 32. Furthermore, relation between the SOA element 65 and the optical fiber 88 are corrected by the lens 33. The optical axes of the SOA element 65 and the optical fiber 88 are lens-coupled by the lens 33.

After completing the correction of the optical axes by each lens as described above, the fixing sections 17a, 17b of the optical element holder 10, specifically the weld parts 14a, 15a are welded to the element carrier 16.

When the fixing sections 17a, 17b of the optical element holder 10 are welded to the element carrier 16, there is a welding stress generated in the weld parts 14a, 15a of the fixing sections 17a, 17b.

In the present invention, the notches 18a, 18b as the stress-suppressing sections are provided between the holding sections 12a, 12b and the fixing sections 17a, 17b of the optical element holder 10. By providing the notches 18a, 18b, the welding stress propagated into the holding sections 12a, 12b through the fixing sections 17a, 17b can be reduced. Accordingly, the welding stress affecting the holding sections 12a, 12b becomes small so that the weld parts 14a, 15a are not to be deformed by the welding stress.

The notches 18a, 18b are in a simple shape to be easily fabricated by cutting, scraping and the like.

In other words, the optical element holder 10 has a configuration in which the fixing sections 17a, 17b are provided on both sides of the pedestal 11 and the notches 18a, 18b are provided between the fixing sections 17a, 17b and the holding sections 12a, 12b. After adjusting the optical element holder 10 in the optimum position, the optical element holder 10 is laser-welded to the element carrier 16. The tensile stress generated at this time is reduced by the notches 18a, 18b so that it does not propagate into the holding sections 12a, 12b. Thus, the holding sections 12a, 12b are not to be deformed. Subsequently, the position of the frame 132 is adjusted and the frame 132 is laser-welded to the holding sections 12a, 12b of the U-shape optical element holder 10.

Figure 9:
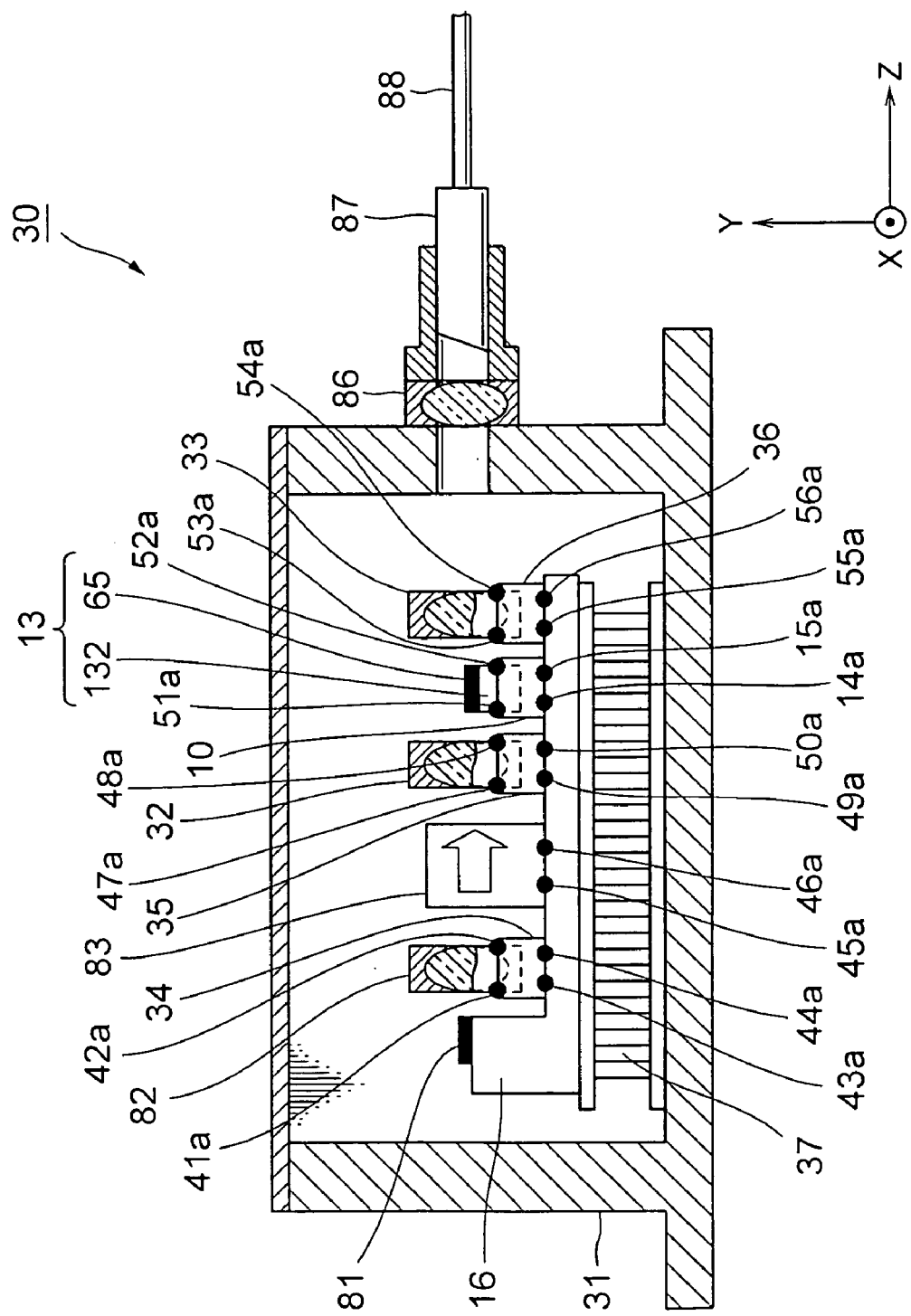
FIG. 9 is a block diagram showing a second embodiment of the laser module according to the present invention.
Figure 10:
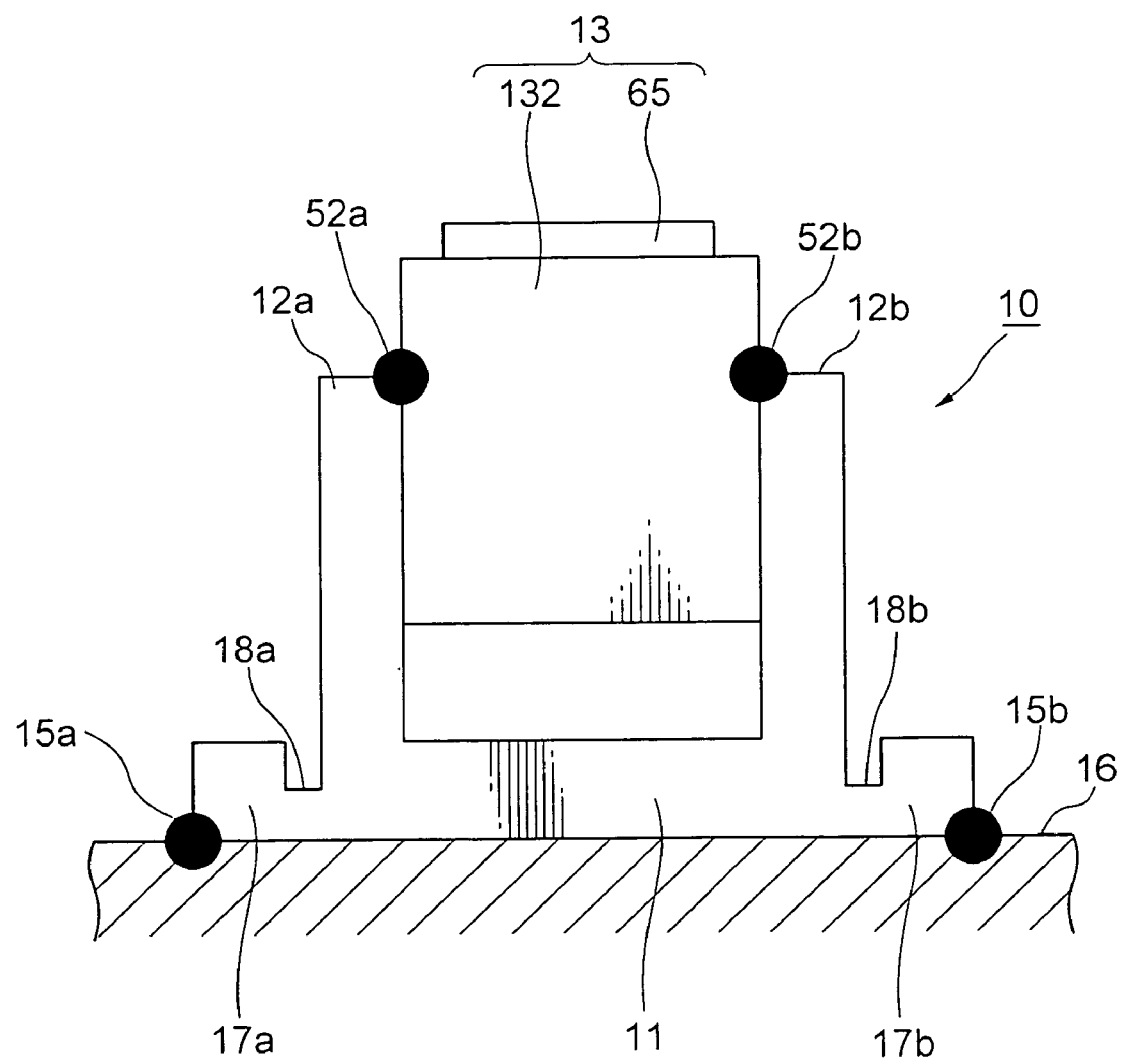
FIG. 10 is a front elevational view of the optical element holder of FIG. 7 as shown in FIG. 8 as viewed from the Z-axis direction.

FIG. 9 is a block diagram showing a second embodiment of the laser module according to the present invention. FIG. 10 is a front elevational view of the optical element holder shown in FIG. 9 viewed from the Z direction. In the followings, description will be provided by referring to the drawings. In FIG. 9 and FIG. 10, the same numeral codes are applied to the identical parts as the ones used in FIG. 6 to FIG. 8, and the description will be omitted.

Basically, a laser module 30 of the embodiment comprises: a DFB laser element 81 for outputting signal light; an SOA element 65 for amplifying the signal light outputted from the DFB laser element 81; an element carrier 16 to which the DFB laser element 81 and the SOA element 65 are fixed with the optical axes being adjusted with each other; an optical element holder 10 for fixing the SOA element 65 to the element carrier 16; a package 31 for enclosing the DFB laser element 81, the SOA element 65, the element carrier 16 and the optical element holder 10; and an optical fiber 88 for guiding the light signal amplified by the SOA element 65 to the outside the package 31.

Further, in laser module 30, lenses 82, 32, 33, 86, U-shape optical element holders 34, 35, 36, an optical isolator 83, a Peltier element 37, a ferrule 87 and the like are provided. The lens 82 guides the signal light outputted from the DFB laser element 81 to the optical isolator 83. The optical isolator 83 prevents the return light to the DFB laser element 81. The lens 32 concentrates the signal light from the optical isolator 83 onto the SOA element 65. The lenses 33, 86 concentrate the signal light amplified by the SOA element 65 to the optical fiber 88. The Peltier element 37 keeps the DFB laser element 81 and the SOA element 65 at a constant temperature.

The frame 82a of the lens 82 is fixed to an optical element holder 34 through weld parts 41a, 42a and the optical element holder 34 is fixed to the element carrier 16 through weld parts 43a, 44a. The optical isolator 83 is fixed to the element carrier 16 through weld parts 45a, 46a. The lens 32 is fixed to an optical element holder 35 through weld parts 47a, 48a and the optical element holder 35 is fixed to the element carrier 16 through weld parts 49a, 50a. The SOA element 65 is die-bonded to the frame 132 and the frame 132 is fixed to the optical element holder 10 through weld parts 51a, 52a and the optical element holder 10 is fixed to the element carrier 16 through weld parts 14a, 15a. The lens 33 is fixed to an optical element holder 36 through weld parts 53a, 54a and the optical element holder 36 is fixed to the element carrier 16 through weld parts 55a, 56a. The weld parts 14a, 15a, 41a to 56a are formed by laser welding using YAG laser. In FIG. 9, weld parts (not shown), which are symmetrical with the weld parts 14a, 15a, 41a to 56a, are also provided on the opposite side which cannot be seen in the illustration.

Conventionally, it is extremely difficult to enclose the DFB laser element 81 and the SOA element 65 in one package 31 since the optical positioning of the DFB laser element 81 and the SOA element 65 is difficult to be performed. The reason is as follows. The laser welding is required for determining the positions with a high precision, however, the conventional U-shape holder is deformed by the stress when welding even by the laser welding. Therefore, in the embodiment, the DFB laser element 81 and the SOA element 65 are positioned with a high precision using the optical element holder 10 which is not easily deformed at the time of welding. Thereby, the laser module 30 in which the DFB laser element 81 and the SOA element 65 are enclosed in one package 31 is achieved.

Next, the manner of assembling the laser module 30 will be described.

In order to make the diffused light emitted from the DFB laser element 81 be collimated light, the lens 82 is adjusted in the X-axis direction, Y-axis direction and Z-axis direction while driving the DFB laser element 81, and the lens 82 is fixed to the element carrier 16 by YAG laser welding. The optical isolator 83 is disposed in almost the center of the collimated light so that the collimated light from the lens 82 passes through the optical isolator 83, and the optical isolator 83 is fixed to the element carrier 16 by YAG laser welding. The lens 32 has a function of focusing the incoming collimated light at a specific distance. It is adjusted to be almost in the center of the collimated light and fixed to the element carrier 16 by YAG laser welding.

The SOA element 65 is adjusted to the position where the light from the lens 32 focuses on. That is, the frame 132 to which the SOA element 65 is mounted is adjusted in the X-axis direction, Y-axis direction and Z-axis direction through the optical element holder 10. Then, the optical element holder 10 is fixed to the element carrier 16 by YAG laser welding.

It will be described more specifically. First, the frame 132 is inserted to the optical element holder 10 and the frame 132 is set in an instrument which is capable of adjusting it in the three axes direction of X, Y and Z. When the light of the DFB laser element 81 effectively enters the SOA element 65, the light is amplified and a larger output of light can be achieved. By utilizing the effect, the frame 132 is adjusted in the optimum position by monitoring the optical output from the SOA element 65 to be the maximum using an optical power meter and the like.

After the adjustment, the optical element holder 10 and the element carrier 16 are fixed by YAG laser welding. Thereby, the position of the frame 132 in regards to the X direction is fixed. At this time, the conditions such as the output power and the time of performing YAG laser welding are set beforehand to be the optimum so that cracks are not generated in the metal joint area, i.e., the weld parts 14a, 15a, after the welding.

Subsequently, after adjusting the frame 132 to be in the optimum position in the movable directions of Y-axis and Z-axis, to make sure, the frame 132 and the optical element holder 10 are fixed once again by YAG laser welding.

In the same manner, the lenses 33 and 86 are adjusted and fixed. At last, the optical fiber 88 is adjusted and fixed in the optimum position by monitoring the optical output.

Needless to say, the present invention is not limited to the above-described embodiments. For example, a semiconductor optical modulator may be used instead of using the SOA element. The stress-suppressing section may be formed by through-holes provided in the fixing sections instead of providing the notches.

In the semiconductor laser module according to the present invention, a plurality of the semiconductor optical elements are enclosed inside a package so that the number of carriers, packages, electronic cooling elements, signal light output devices and the like can be reduced. At the same time, it becomes unnecessary to connect the signal light output device (for example, the optical fiber). Thereby, it enables to reduce the number of components, reduce the size, and simplify the manufacture and the like. Also, only the good-quality items of each optical element can be mounted on the element carrier so that the yield can be improved compared to the monolithic type. In addition, not only the number of the electronic cooling elements but also the number of accompanying components such as controllers can be more reduced compared to the conventional cases. Also, each of the semiconductor optical elements can be maintained at the same temperatures so that the temperature properties can be stabilized. Further, the following effect can be expected.

Furthermore, in the semiconductor laser module according to the present invention, the optical element holder for fixing the semiconductor optical element to the carrier has a mechanism for hindering the stress propagation. Thus, deformation at the time of welding is hard to be caused and the position of the semiconductor optical element can be determined with a high precision. Therefore, the optical positioning of the semiconductor optical elements with respect to each other becomes easy, which enables to easily achieve a semiconductor laser module in which a plurality of semiconductor optical elements are enclosed in one package.

Further, in the semiconductor laser module according to the present invention, used is the optical element holder in which a stress-suppressing section is provided between the weld part and the holding section. Thereby, the welding stress propagated into the holding section can be successfully prevented or eased so that the position of the semiconductor optical element can be determined with a high precision.

Furthermore, in the semiconductor laser module according to the present invention, the notches are provided in the fixing sections of the optical element holder so that the stress-suppressing section can be achieved with a simple configuration.

Moreover, in the semiconductor laser module according to the present invention, the electronic cooling element is provided between the package and the element carrier to which a plurality of semiconductor optical elements are mounted. Thereby, each of the semiconductor optical elements can be maintained at the same temperatures so that the temperature property can be stabilized.

Further, in the semiconductor laser module according to the present invention, the semiconductor laser element and the semiconductor optical amplifier are enclosed inside the same package. Thereby, the number of the carriers, the packages, the optical fibers and the like are reduced. At the same time, it becomes unnecessary to connect the optical fiber. Thus, it enables to reduce the number of components, reduce the size, simplify the manufacture and the like. Further, only the good-quality items of the semiconductor laser element and the semiconductor optical amplifier can be mounted so that the same configuration as that of a case where the semiconductor laser element and the semiconductor optical amplifier are integrated in one chip can be obtained. In addition, the semiconductor optical amplifier and the semiconductor laser element are mounted on the same carrier. Thereby, the temperature of the semiconductor optical amplifier can be also controlled sufficiently by performing a temperature control only on the semiconductor laser element. Therefore, the configuration of the temperature control can be simplified.

In a method of fabricating the semiconductor laser module according to the present invention, the position of a second semiconductor optical element is determined using the optical element holder which is hard to be deformed by welding. Thereby, the second semiconductor optical element can be fixed with a high precision with respect to a first semiconductor optical element.

In addition, in the method of fabricating the semiconductor laser module according to the present invention, the position of the semiconductor optical amplifier is determined using the optical element holder which is hard to be deformed by welding. Thereby, the semiconductor optical amplifier can be fixed with a high precision to the position for receiving the signal light outputted from the semiconductor laser element.

What is claimed is:

1. A semiconductor laser module, comprising a first semiconductor optical element, a second semiconductor optical element, and a lens, wherein:
   the first semiconductor optical element is for outputting a light signal;
   the second semiconductor optical element is for performing signal processing on the light signal outputted from the firs semiconductor optical element, said first and second optical elements mounted on element holding sections;
   the lens is for correcting a relation between optical axes of the first semiconductor optical element and the second semiconductor optical element so as to lens-couple the optical axes, said lens mounted on a lens holder disposed between said first and second semiconductor optical elements, said lens holder comprising a pedestal having fork-shaped holding sections, fixing sections for fixing said pedestal to a common element carrier, and a stress-suppressing section disposed between said holding sections and said fixing sections to prevent welding stress, the stress-suppressing section including a notch between the fixing section and the holding section; and
   the first semiconductor optical element, the second semiconductor optical element and the lens are mounted on the common element carrier;
   wherein the stress-suppressing section reduces tensile stress generated when the lens holder is welded to the common element carrier so that the stress does not propagate into the fork-shaped holding sections, to thereby prevent the fork-shaped holding sections from being deformed.

2. The semiconductor laser module according to claim 1, wherein:
   the element carrier is supported by an electronic cooling element to be installed inside a package; and
   the electronic cooling element is for cooling the element carrier.

3. The semiconductor laser module according to claim 1, wherein:
   the first semiconductor optical element is a semiconductor laser element for outputting laser light; and
   the second semiconductor optical element is a semiconductor optical amplifier for amplifying the light signal by exciting it in an active layer through supplying an electric current and then outputting the amplified light signal.

4. The semiconductor laser module according to claim 1, wherein:
   the first semiconductor optical element is a semiconductor laser element for outputting laser light; and
   the second semiconductor optical element is a semiconductor optical modulator far modulating and outputting the laser light outputted from the semiconductor laser element.

5. The semiconductor laser module according to claim 4, wherein the semiconductor optical modulator as the second semiconductor optical element is formed integrally with the semiconductor laser element in one chip.

6. The semiconductor laser module according to claim 2, wherein the element carrier comprises: element holding sections to which the semiconductor optical elements are mounted; and said lens holder for adjusting a holding position of the lens with respect to the semiconductor optical elements three-dimensionally.

7. The semiconductor laser module according to claim 6, wherein the element carrier comprises the element holding sections and the lens holder on one surface, and an opposite surface is formed flat to be supported by the electronic cooling element.

8. The semiconductor laser module according to claim 3, further comprising an optical isolator disposed between the semiconductor laser element and the semiconductor optical amplifier, wherein
   the semiconductor laser element and the optical isolator are lens-coupled by a lens while the optical isolator and the semiconductor optical amplifier are lens-coupled by a lens, respectively.

9. A method of assembling a semiconductor laser module, comprising:

a mounting step of mounting, on a common element carrier, a first semiconductor optical element for outputting light signal and a second semiconductor optical element for performing signal processing on the light signal outputted from the first semiconductor optical element; and a coupling step of lens-coupling the first semiconductor optical element and the second semiconductor optical element by a lens, said lens mounted on a lens holder disposed between said first and second semiconductor optical elements, said lens holder comprising a pedestal having fork-shaped holding sections, fixing sections for fixing said pedestal to said common element carrier, and a stress-suppressing section disposed between said holding sections and said fixing sections to prevent welding stress, the stress-suppressing section including a notch between the fixing section and the holding section;

wherein the stress-suppressing section reduces tensile stress generated when the lens holder is welded to the common element carrier so that the stress does not propagate into the fork-shaped holding sections, to thereby prevent the fork-shaped holding sections from being deformed.

10. The method of assembling a semiconductor laser module according to claim 9, wherein
   in the coupling step, a relation between optical axes of the first semiconductor optical element and the second semiconductor optical element being mounted on the element carrier is corrected so as to lens-couple the optical axes by the lens.

* * * * *